(12) United States Patent
Malisic et al.

(10) Patent No.: US 12,665,042 B2
(45) Date of Patent: Jun. 23, 2026

(54) WRITE LATENCY TESTING SYSTEMS AND METHODS

(71) Applicant: Advantest Corporation, Tokyo (JP)

(72) Inventors: Srdjan Malisic, San Jose, CA (US); Chi Yuan, San Jose, CA (US)

(73) Assignee: Advantest Corporation, Tokyo (JP)

( * ) Notice: Subject to any disclaimer, the term of this patent is extended or adjusted under 35 U.S.C. 154(b) by 154 days.

(21) Appl. No.: 18/789,412

(22) Filed: Jul. 30, 2024

(65) Prior Publication Data

US 2026/0038618 A1     Feb. 5, 2026

(51) Int. Cl.
*G11C 29/12* (2006.01)
*G11C 29/56* (2006.01)

(52) U.S. Cl.
CPC .... *G11C 29/1201* (2013.01); *G11C 29/56012* (2013.01); *G11C 2029/5602* (2013.01)

(58) Field of Classification Search
CPC .......... G11C 29/1201; G11C 29/56012; G11C 29/5602
See application file for complete search history.

(56) References Cited

U.S. PATENT DOCUMENTS 11,861,193 B2     1/2024  Jacob et al.
11,947,472 B2     4/2024  Shah et al.

| | | | | |
|---|---|---|---|---|
| 2005/0081113 A1* | 4/2005 | Beard | | G06F 30/33 |
| | | | | 714/39 |
| 2010/0102840 A1* | 4/2010 | Ueda | | G01R 31/31905 |
| | | | | 324/756.01 |
| 2022/0004330 A1 | 1/2022 | Guim Bernat et al. | | |
| 2022/0326874 A1 | 10/2022 | Del Gatto et al. | | |
| 2024/0095135 A1 | 3/2024 | Malisic et al. | | |

FOREIGN PATENT DOCUMENTS

| | | |
|---|---|---|
| CN | 117687889 | 3/2024 |
| WO | 2023193814 A1 | 10/2023 |

OTHER PUBLICATIONS

Zhonghua Wang; et al: RCMP: Reconstructing RDMA-Based Memory Disaggregation via CXL; Source: https://dl.acm.org/doi/10.1145/3634916; Publication date: Jan. 19, 2024; 26 pages.

* cited by examiner

*Primary Examiner* — Han Yang

(57) ABSTRACT

The testing system comprises a processor and a local memory on a motherboard and an extension memory device under test (DUT). The local memory corresponds to a first address range within system memory and the extension memory DUT associated with a second address range within the system memory. The processor is operable to direct write latency testing of the extension memory DUT, including recording write latency measurement values. The recording can be done in a frequency table and the frequency table can be visualized (e.g., rendered, etc.) on a display. The testing comprises non-temporal write instructions that bypass processor caches. The extension memory DUT is compatible with a compute express link (CXL) protocol.

20 Claims, 11 Drawing Sheets

100

200

210
Performing a write information access process.

220
Performing a write operation measurement process.

230
Performing a write operation measurement process.

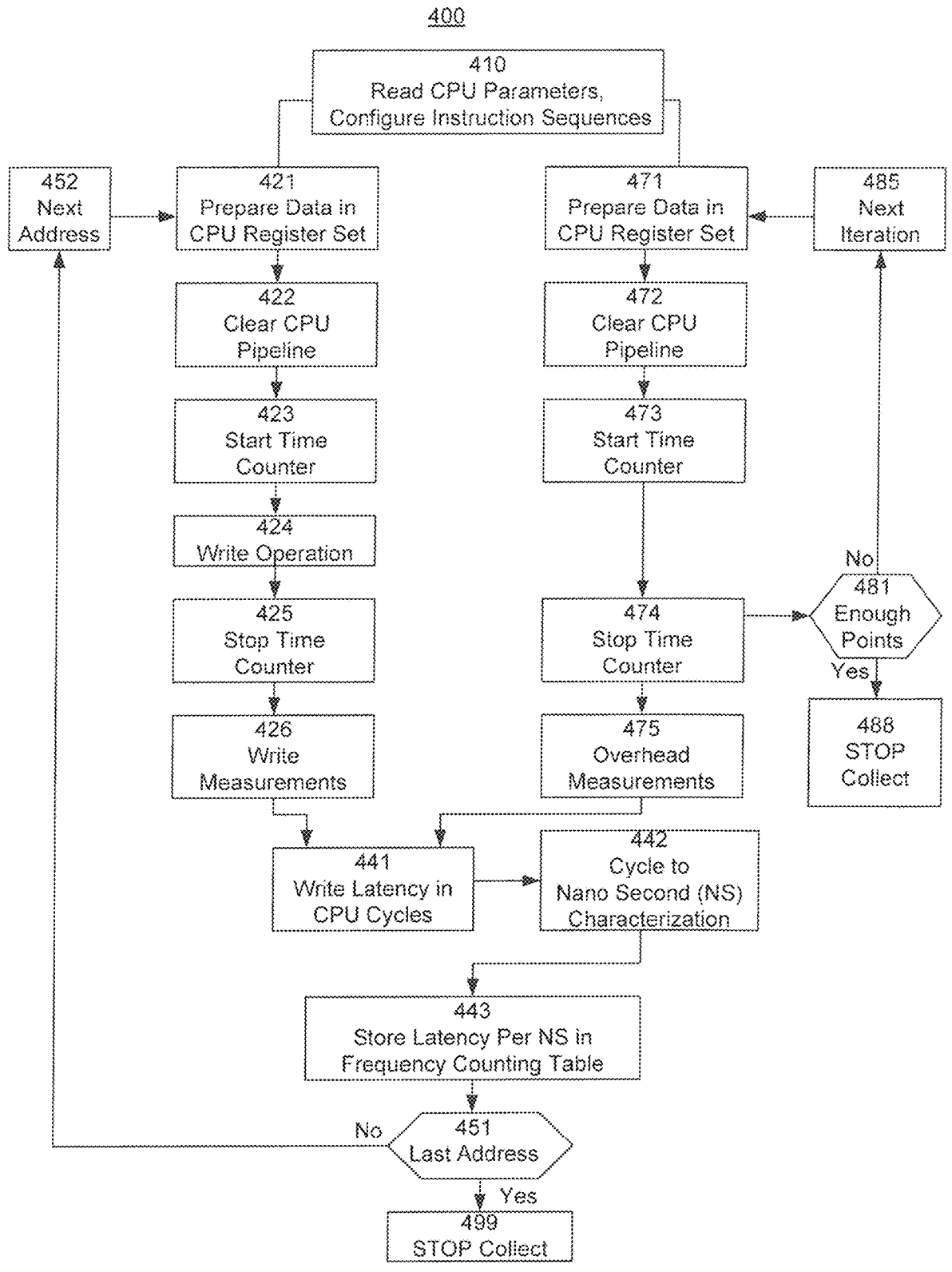

400

410
Read CPU Parameters,
Configure Instruction Sequences

452
Next
Address

421
Prepare Data in
CPU Register Set

471
Prepare Data in
CPU Register Set

485
Next
Iteration

422
Clear CPU
Pipeline

472
Clear CPU
Pipeline

423
Start Time
Counter

473
Start Time
Counter

424
Write Operation

425
Stop Time
Counter

474
Stop Time
Counter

No
481
Enough
Points

Yes

426
Write
Measurements

475
Overhead
Measurements

488
STOP
Collect

441
Write Latency in
CPU Cycles

442
Cycle to
Nano Second (NS)
Characterization

443
Store Latency Per NS in
Frequency Counting Table

No          451
Last Address

Yes

499
STOP Collect

510
Accessing a Portion of Write Data.

520
Loading the Portion of Write Data in a CPU Register Set.

530
Forwarding the Portion of Write Data to a DUT and Storing the
Portion of Write Data in the DUT.

540
Tracking a Duration Associated with Operations of Block 530.

545
Optionally Repeating Iterations of Blocks 510 through 540.

550
Utilizing the Duration Measurements in a
DUT Performance Analysis

<u>600</u>

700
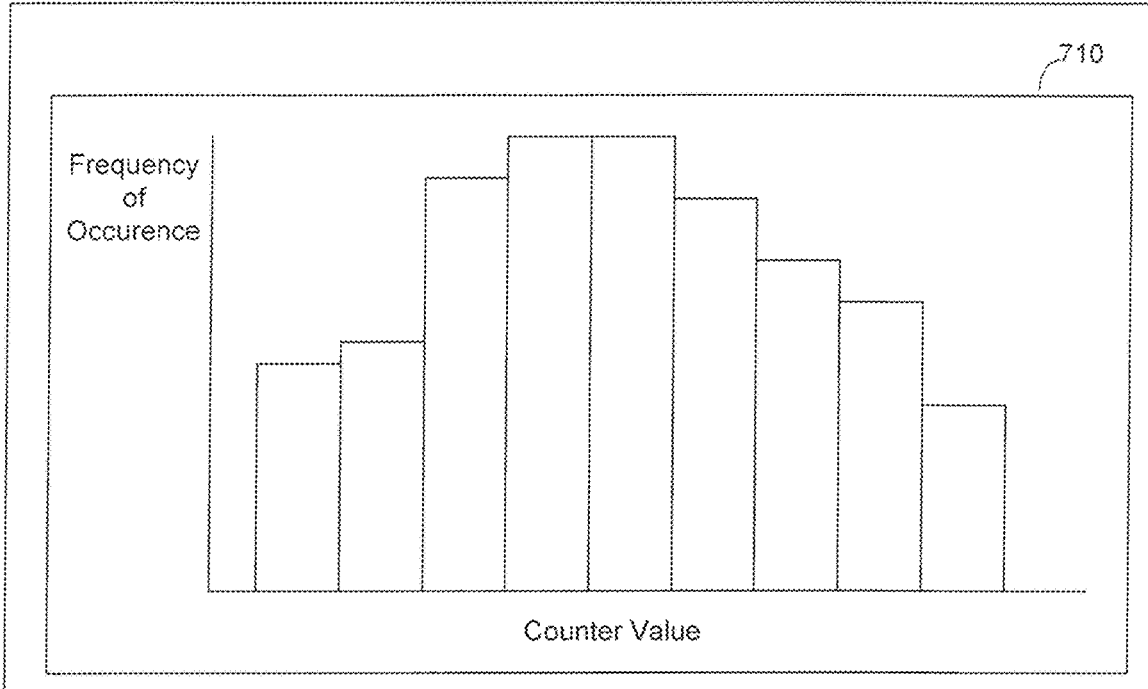
Average XXX ns (YYY counts)  Median AAA ns (BBB counts) Standard Deviation (NNN)
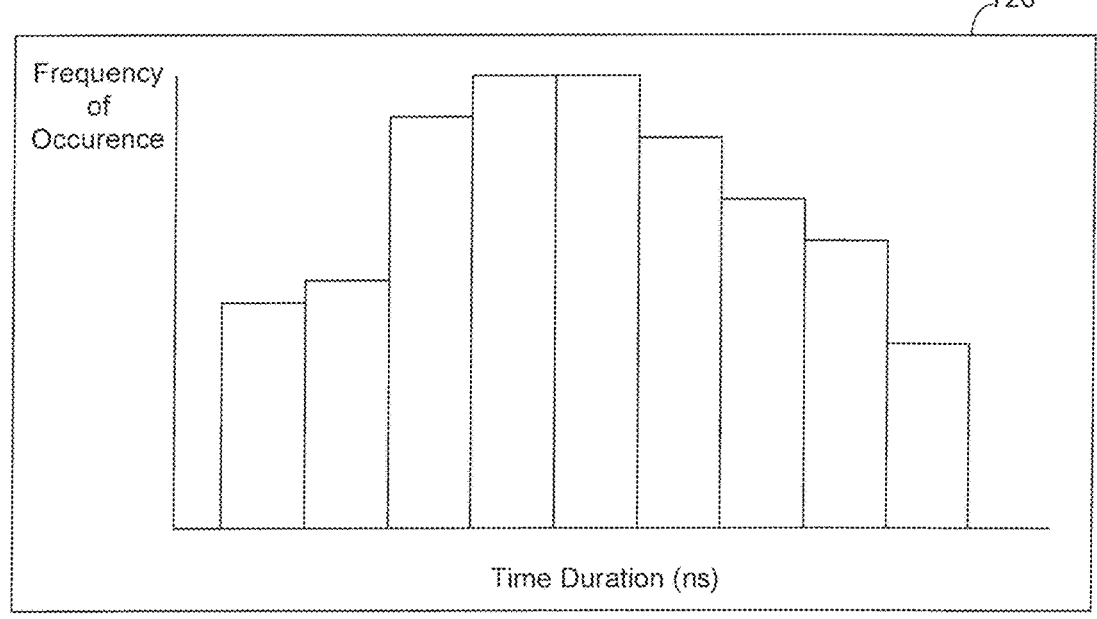
FIG. 7

1200

WRITE LATENCY TESTING SYSTEMS AND METHODS

FIELD OF THE DISCLOSURE

Embodiments of the present disclosure relate to testing systems for testing memory devices. More specifically, embodiments are directed to testing capabilities of devices under test (DUTs) that are compute express link (CXL) protocol compliant.

BACKGROUND OF THE DISCLOSURE

Electronic systems and devices have made significant contributions towards the advancement of modern society and have facilitated increased productivity and reduced costs in analyzing and communicating information in a variety of business, science, education, and entertainment applications. New information storage devices and protocols are pursued to address the ever-increasing desire to process more information. Latency within these electronic systems (e.g., computer systems, servers, etc.) is a measure of time taken by the computer to execute instructions and latency can be a measure of system performance. For a number of different reasons, the latency of reading data from memory and the latency of writing data to memory become important measures of performance and operability.

If the instruction is a data read, "read latency" is the time it takes for the data to come back to the processor from the memory. If the instruction is a write, "write latency" is the time for the write acknowledgement to return to the processor. Different systems may have different latency, due to hardware characteristics, mechanical movement, signal distance, and processing logic design. Also, latency may be added if additional hardware is inserted into the data path and/or if the memory is external to the system board on which the processor resides.

Compute Express Link (CXL) is one protocol that assists in communication and operation between a processor located on a system board and external ("extension") memory coupled to the system board, e.g., perhaps via an interface hardware, etc. CXL is a relatively new communication (e.g., bus, etc.) protocol to the electronic device industry (e.g., memories, etc.) and as such there are many challenges that needed to be solved for the CXL protocol to be used in a testing environment on CXL enabled devices under test (DUTs). In particular, during normal non-test operation, CXL enabled memory devices are typically external to the central processing unit (CPU) and are used to provide additional shared storage resources for system memory.

The basic normal purpose of a CXL type external memory device is to function as additional shared main system memory resources and this characteristic can make testing the device particularly problematic. The CXL protocol is currently primarily designed for normal computer use of devices, not for testing, and especially not for testing multiple CXL devices in parallel, and many challenges traditionally needed to be solved to allow efficient and effective testing using the CXL protocol.

As a memory device, a CXL enabled memory device's primary function is to store (e.g., track, retain, etc.) information and the two principal operations for a CXL enabled device are to read and write information. As the desire for ever increasing amounts of information to be processed and stored at faster rates, measurement of read latency and write latency are important. Automatic Test Equipment (ATE)

traditionally do not efficiently and effectively address write latency measurement (e.g., for CXL system memory, etc.) and traditional test systems and methods provided very little or no testing capabilities associated with testing CXL compliant Devices Under Test (DUTs). It is desired, therefore, to provide an accurate measurement of write latency for electronic components that utilize external memory and the CXL protocol, and, in particular, it would be desired to measure this write latency in a test system environment.

SUMMARY

Embodiments of the present invention include a system of testing and a method for testing involving a motherboard having a processor situated thereon and external memory devices coupled to the motherboard. The testing method includes measuring write latency of data from the processor to the external memory. Using the novel method, the write latency of data from the processor to external memory can be measured over a plurality of data write operations and the results are stored in a frequency table within local memory of the motherboard. The data that is written to compute the write latency with respect to the external memory can come from user data within the local memory, or can be algorithmically generated. The frequency table can be visualized on a display screen either graphically or in tabular form. In one embodiment, the write latency is measured in cycles of the processor by a counter that is started and then stopped by instructions that are before and after the write instruction in code sequence. The latency measurement is then converted to nanoseconds within the frequency table. The frequency table data can be used to determine performance and operability of the external memory. In one embodiment, the external memory is extension memory compatible with the CXL communication protocol.

More specifically, presented embodiments of the present disclosure facilitate efficient and effective write latency testing (e.g., measurement) in a test system. In some embodiments, a method of determining write latency in a testing system comprises a motherboard (e.g., comprising a processor, local memory, etc.) and an external memory device under test (DUT) coupled to the motherboard. The method comprises: a) storing an address within a memory range pertaining to the external memory DUT into registers of the processor; b) storing a data piece of user data into registers of the processor; c) starting a counter in the processor; d) performing a write operation of the data piece from the registers to the address in the memory range of the external memory DUT; e) recording a counter value of the counter upon completion of the write operation; f) storing the recorded counter value into a frequency table; and g) repeating steps a)-f) for a next address within the memory range pertaining to the external memory DUT and for a next data piece of the user data until the user data is written to the external memory DUT. The method further comprises determining the memory range pertaining to the external memory DUT by the processor interfacing with a CXL compliant protocol. The frequency table can be stored in the local memory, wherein the user data is stored in the local memory and the method further comprises rendering a visualization of the frequency table. Step c) of starting a counter in the processor can comprise: c1) clearing a pipeline of the processor; and c2) starting the counter in the processor.

In some embodiments the method comprises computing an overhead counter value based on: loading a data piece of the user data and an address into registers of the processor; clearing a pipeline of the processor; starting the counter; and recording a counter value from the counter, and wherein the e) recording counter value of the counter upon completion of the write operation comprises subtracting the overhead counter value from the recorded counter value. The user data can be algorithmically generated data. The frequency table comprises a respective entry for each recorded counter value for each data piece of the user data written to the external memory DUT. The counter values of the frequency table can be converted to nanosecond values. In some exemplary implementation the processor comprises a processor cache memory and the write operation comprises a non-temporal instruction type that does not utilize the processor cache memory. The next address and the next piece of data can be selected based on a user input stride value.

In some embodiments, a testing system comprises a motherboard and an extension memory device under test (DUT). The motherboard comprises a processor and a local memory, wherein the local memory corresponds to a first address range within system memory boundaries associated with the processor. The extension memory device under test (DUT) is configured to couple with the motherboard, the extension memory DUT associated with a second address range within the system memory, wherein the processor is operable to direct testing of the extension memory DUT, and wherein the testing comprises recording write latency of a plurality of write operations to the extension memory DUT. The recording can be done in a frequency table and the frequency table can be visualized (e.g., rendered, etc.) on a display. In some embodiments, the extension memory DUT is compatible with a compute express link (CXL) protocol. The testing comprises non-temporal write instructions. In some exemplary implementations the extension memory DUT is one of a plurality of external user DUTs that are independently tested concurrently.

DESCRIPTION OF THE DRAWINGS

The accompanying drawings, which are incorporated in and form a part of this specification, are included for exemplary illustration of the principles of the present disclosure and not intended to limit the present disclosure to the particular implementations illustrated therein. The drawings are not to scale unless otherwise specifically indicated.

FIG. 4 is a block diagram of an exemplary test method for determining write latency from a processor to an extension memory device in accordance with embodiments of the present disclosure.

FIG. 7 is an exemplary graphical presentation of DUT write latency information stored in a frequency table in accordance with embodiments of the present disclosure.

DETAILED DESCRIPTION

Reference will now be made in detail to the preferred embodiments of the disclosure, examples of which are illustrated in the accompanying drawings. While the disclosure will be described in conjunction with the preferred embodiments, it will be understood that they are not intended to limit the disclosure to these embodiments. On the contrary, the disclosure is intended to cover alternatives, modifications, and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be obvious to one ordinarily skilled in the art that the present disclosure may be practiced without these specific details. In other instances, well known methods, procedures, components, and circuits have not been described in detail as not to unnecessarily obscure aspects of the current disclosure.

Figure 1:
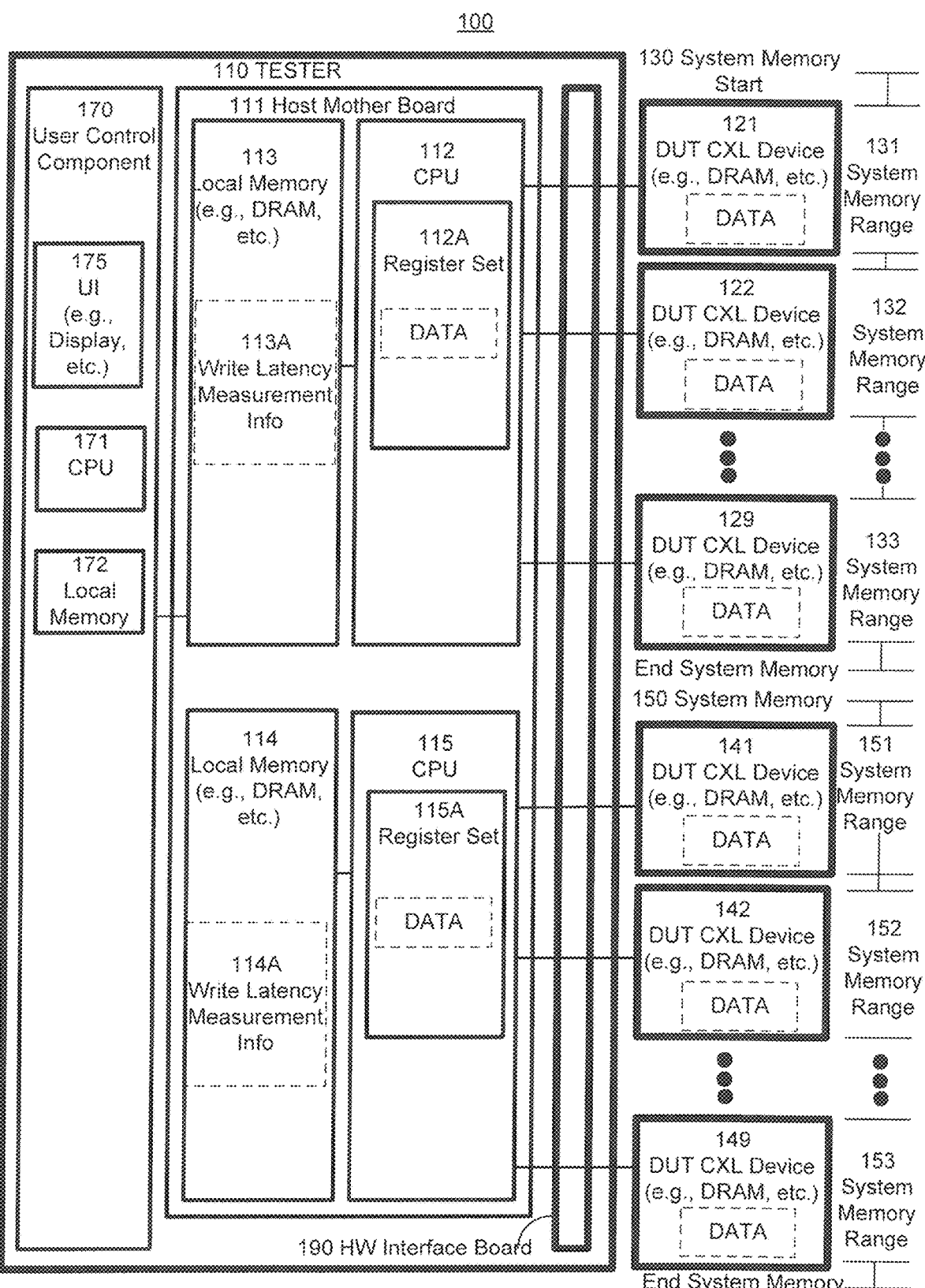
FIG. 1 is a block diagram of an exemplary test system having multiple extension memory devices in accordance with embodiments of the present disclosure.

FIG. 1 is a block diagram of an exemplary test system 100 in accordance with embodiments of the present disclosure. Test system 100 includes tester hardware 110 and extension memory DUTs 121, 122, 129, 141, 142, 149, and so on. Tester 110 includes host motherboard 111 coupled to user control component 170 and hardware (HW) interface board 190, which in turn is coupled to the extension memory DUTs (e.g., 121 through 149, etc.). User control component 170 can be a computer system having a display. Host motherboard 111 includes CPU 112, CPU 115, local memory 113 and local memory 114. User control component 170 includes CPU 171 and is coupled to local memory 172 and user interface 175. As will be described further below, tester 110 includes software that provides measurement of write latency of data written from a processor of the motherboard 111 to the extension memory DUTs. This write latency allows the performance of the extension memory DUTs to be measured.

In some embodiments, extension memory DUTs normally provide external extension of system memory for processors included in various devices (e.g., computers, servers, etc.). In some embodiments, the extension memory DUTs 121, 122, and 129 are included in system memory 130 associated with CPU 112 and extension memory DUTs 141, 142, and 149 are included in system memory 150 associated with CPU 115. The extension memory DUTs 121, 122, and 129, can be assigned to respective system memory ranges 131, 132, and 133 of system memory 130. The extension memory DUTs 141, 142, and 149 can be assigned to respective system memory ranges 151, 152, and 153 of system memory 150. The extension memory DUTs can have various configurations. In some embodiments, the extension memory DUTs are DRAM compatible with a CXL protocol. In some exemplary implementations, write data is written/stored in the extension memory DUTs as part of testing operations. Regarding extension memory DUTs that are compatible with the CXL protocol, they are able to report their addresses ranges to the processor located on the motherboard in accordance with the CXL protocol so that the processor can access their external memory.

CPU 112 includes a register set 112A for temporarily storing information, including temporarily storing information associated with write operations (e.g., the write data, the corresponding write addresses, etc.). CPU 115 also includes a register set 115A for temporarily storing information, including temporarily storing data and address information associated with write operations. Local memory 113 stores information (e.g., write latency measurement information 113A) for CPU 112, including information associated with storing write data to be written to the extension memory DUTs. Local memory 114 stores information (e.g., write latency measurement information 114A) for CPU 115, including information associated with storing write data to the extension memory DUTs. User data to be written to the extension memory DUTs may reside in the local memories of the motherboard or may be algorithmically generated then written to the extension memory DUTs.

Both, extension memory DUTs and local memories can be considered part of the respective host memory space. Local memory 113 and extension memory DUTs 121, 122, and 129 can be considered part of CPU 112 system memory. Local memory 114 and extension memory DUTs 141, 142, and 149 can be considered part of CPU 115 system memory.

User control component 170 enables a user to interact with test system 100 and in particular allows the write latency data measured by tester 110 to be viewed. CPU 171 processes information associated with user control and interaction with test system 100. Local memory 172 stores information associated with CPU 171 operations, including information associated with user control and interaction with test system 100. As mentioned above, user interface 175 provides output information to users and receives input information from a user. In some exemplary implementations, user interface includes a display that presents graphical or tabular representations of write latency information associated with extension memory DUTs of test system 100.

Figure 2:
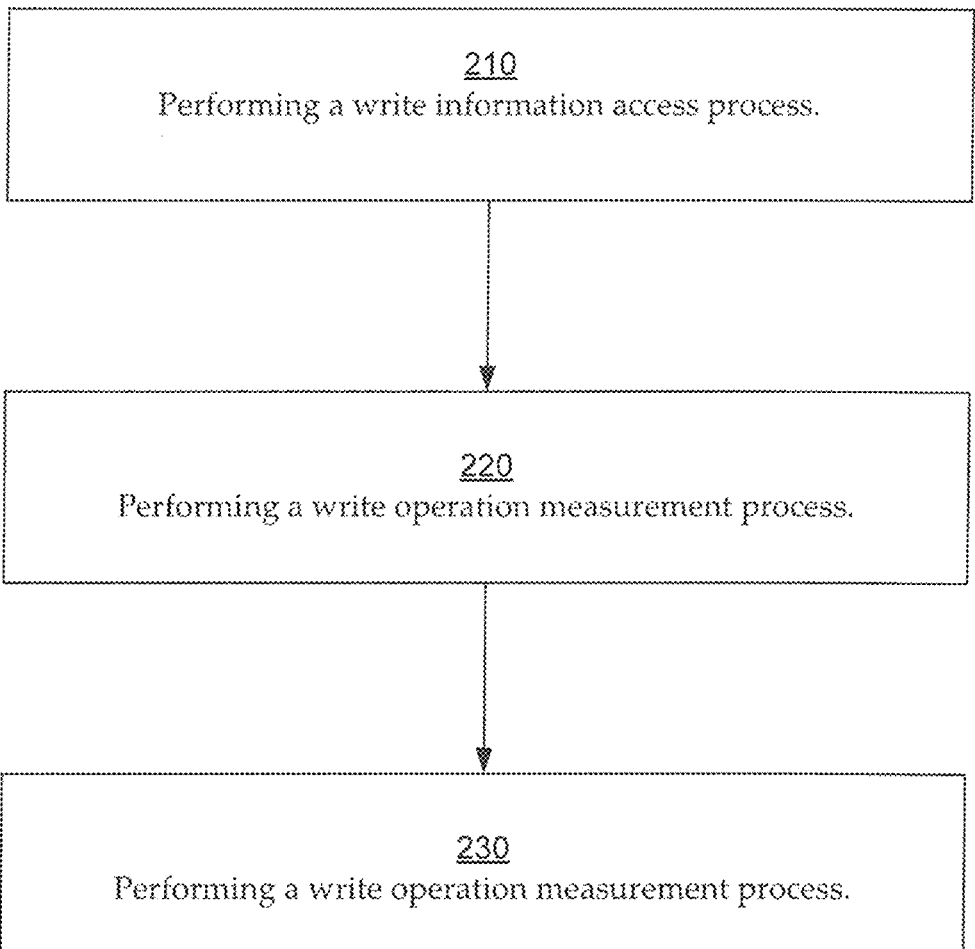
FIG. 2 is a block diagram of an exemplary write latency test method in accordance with embodiments of the present disclosure.

FIG. 2 is a block diagram of an exemplary write latency test method 200 in accordance with embodiments of the present disclosure. Write latency test method 200 provides information associated with write latencies from the processors of the motherboard 111 to extension memory DUTs. The extension memory DUTs can be compatible with CXL protocols.

In block 210, a write information access process is performed. The write information includes data to be written/stored in an extension memory DUT location and a corresponding extension memory DUT address corresponding to the location the write data is to be written to/stored in. The write information can be predetermined (e.g., by a user, artificial intelligence, etc.) and stored in the local memory or the write information can be generated on the fly by an algorithm. The write information (also called user data) can be based upon various objectives (e.g. write data that is the same at multiple addresses, write data that varies between addresses, addresses that are sequential, addresses that are randomly generated, etc.). In some embodiments, the write information is retrieved from a local memory within the test system and written to an extension memory DUT. Additional description of write information accessing is presented in other portions of this specification.

In block 220, a write operation latency measurement process is performed. The write operation measurement process includes measuring time durations associated with writing the information accessed in block 210 to an extension memory DUT. In some embodiments, the write operation measurement process includes tracking count values from a counter that increments (e.g., at regular intervals or time durations, etc.) while write related operations are being performed. The write operation measurements can include tracking count values while write data and corresponding write address information is transferred from a CPU to an extension memory DUT and stored in the extension memory DUT. The measurement values of the write latency can be obtained from a plurality of write operations and may be stored in a local memory. In some embodiments, the measurement values are tracked/stored in a memory resident frequency table of the local memory. Additional descriptions of write operation measurements are presented in other portions of this specification. The measured write latency values can be used to measure the performance of the extension memory and may be viewed on display 175.

In some embodiments, testing environments have the potential to introduce time durations/delays associated with testing operations that are not associated with the write operation being measured. These durations/delays are considered "overhead" for the system measuring the write latency of the write operation. For instance, instructions for performing the testing write operations (e.g., start timer or testing counter, stop timer or testing counter, etc.) may introduce delays that are not associated with the write operation itself. In addition, for various reasons (e.g., overall testing efficiency, differences in CPUs, etc.) the testing system may include operations (e.g., out of order processing, interrupts, etc.) in the test environment that may or may not occur in a normal non test environment. In some embodiments, durations associated with write operation overheads are tracked and a write operation overhead value is determined. This overhead value is then subtracted to the overall write latency measurements collected by tester 110. In some exemplary implementations, write latency desired for measurement should not include some of the durations associated with write operation overhead and an adjustment is made to subtract out the write overhead, etc. The write operation timing measurements can be expressed in time values (e.g., second, nanoseconds, etc.) associated with count values.

In block 230, a DUT write performance process is performed based upon the write operation measurement results of block 220. The DUT performance process can include statistical analysis. The statistical analysis can include determination of an average write latency value and a distribution of write latency associated with an external memory DUT. In some exemplary implementations, various graphical representations (e.g., a histogram, a distribution curve, etc.) of the write operation measurements can be provided (e.g., rendered on a display, etc.). In some embodiments, write latency related information stored in frequency tables is presented to a user in a graphical form. Additional description of write operation measurements is presented in other portions of this specification (e.g., FIG. 7, etc.).

Figure 3A:
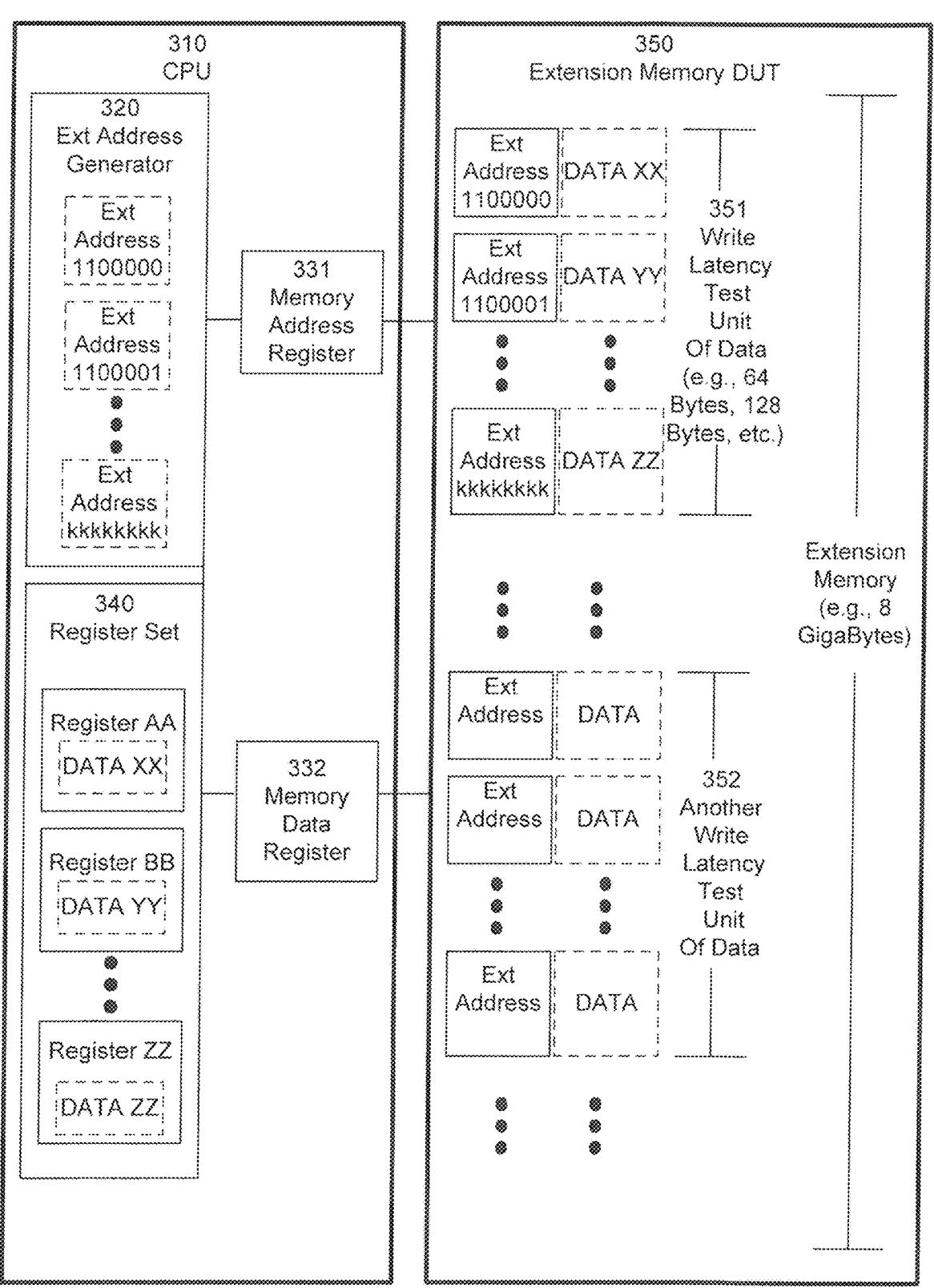
FIG. 3A is a block diagram of exemplary test system having an extension memory device in accordance with embodiments of the present disclosure.

FIG. 3A is a block diagram of exemplary test system 300A in accordance with embodiments of the present disclosure. Test system 300A includes CPU 310 and extension memory DUT 350. In some embodiments, CPU 310 is similar to CPUs 112 and 115. CPU 310 includes extension address generator 320 and register set 340. Extension memory address generator 320 generates address values corresponding to addresses in the extension memory DUT 350. It is appreciated the extension address generator 350 can be a general memory controller address generator that also generates other addresses. In some embodiments, a memory controller address generator generates addresses for other memories (e.g., a local memory such as local memories 113 and 114 in FIG. 1, local memory 370 in FIG. 3B, etc.).

Processor register set 340 temporarily stores write data in registers (e.g., registers AA, BB, ZZ, etc.) that is to be written/stored in data locations of the extension memory DUT 350. The data memory locations are associated with the addresses generated by extension memory address generator 320 and also stored in processor registers 331. It is appreciated the registers can include various register configurations (e.g., AXI, ZMM, etc.)

When a write instruction is initiated, generated addresses from extension address generator are loaded in memory address register 331 and corresponding write data is loaded in memory data register 332. The respective generated addresses and corresponding write data are forwarded to extension memory DUT 350 under control of a write operation using respective address buses and data buses communicatively coupling CPU 310 and extension memory DUT 350 concurrently. In one embodiment, the write instruction used is a non-temporal type of write instruction which ensures the write data is loaded in memory data register 332 and forwarded to extension memory DUT 350 without going through any cache memories (e.g., caches of CPU 310, etc.).

In some embodiments, the addresses and data are communicated in burst mode, and multiple iterations of address and data transmissions/transfers of data occur per write operation instruction. In some exemplary implementations, the data bus is smaller (e.g., 32 lines/bits wide, 64 lines/bits wide, 128 lines/bits wide, etc.) and the write instruction is directed to a larger amount of data (e.g., 64 bytes, 128 bytes, 256 bytes, etc.) that is communicated to the memory in multiple sequential iterations of the smaller amount. In some exemplary implementations, extension memory DUT 350 is a 8 Gigabyte capacity extension memory device and one write latency test unit of data 351 (e.g., 64 bytes, 128, bytes) is written to one portion of extension memory DUT 350 and another write latency test unit of data 352 is written to another portion of extension memory DUT 350.

Figure 3B:
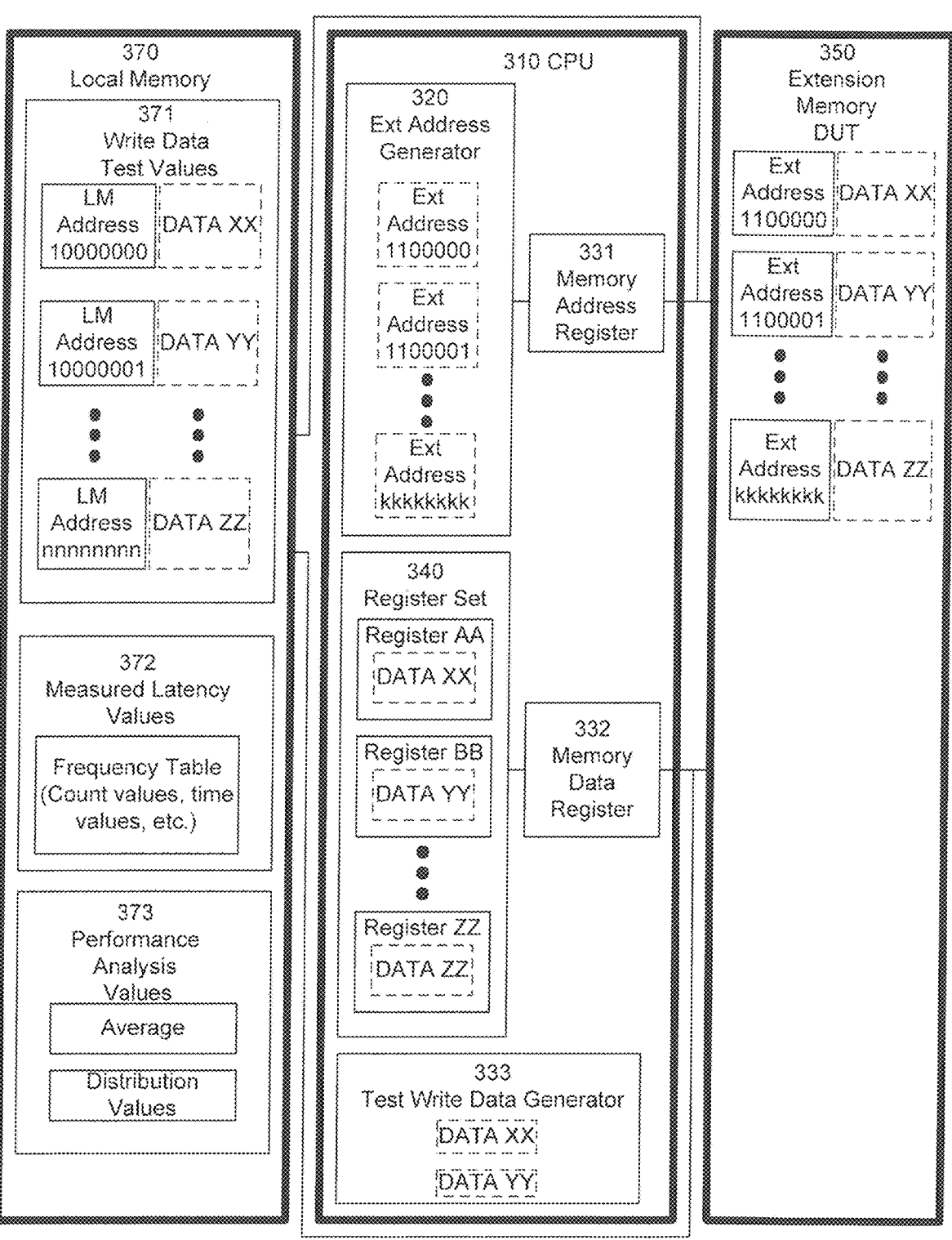
FIG. 3B is a block diagram of another exemplary test system having an extension memory device in accordance with embodiments of the present disclosure.

FIG. 3B is a block diagram of exemplary test system 300B in accordance with embodiments of the present disclosure. Test system 300B is similar to system 300A, except test system 300B also includes local memory 370 associated with CPU 310. Local memory 370 is similar to local memory 113 and 114. In some embodiments, local memory 370 and extension memory DUT 350 are considered different portions of a system memory associated with CPU 310. Local memory 371 includes a portion for storing write data test values 371, a portion for storing measured latency values 372, and a portion for storing statistical analysis values 373. The portion for storing write data test values 371 ("user data") includes local memory (LM) storage address and corresponding storage locations that store write data (e.g., AA, BB, ZZ, etc.). Measured latency values 372 include frequency tables for storing various write latency test measurement results (e.g., count values, time values, etc.). Performance analysis values include various statistical analysis values (e.g., average write latency values, write latency distribution values, etc.).

It is appreciated the write data values can originate from various sources. In some embodiments, the write data values are supplied by a user and stored in local memory 370 and may be referred herein as user data. The write data values can originate from a remote source (e.g., another system, a communication network, etc.) and are stored in local memory 370. The write data values can be generated by test write data generator 333. The values generated by test write data generator 333 can be stored in local memory 370 before they are loaded in register set 340 or they can be loaded directly from test write generator 333 into register set 340.

In some embodiments, write data may flow through a cache when being stored in local memory (e.g., local memory 113, 114, 172, 370, etc.) or loaded in some CPU registers (e.g., register AA, BB, ZZ etc.) but does not flow through a cache in when loading a memory data register (e.g., 332, etc.) and forwarding the write data to an extension memory DUT (e.g., 350, etc.) as part of a non-temporal write operation.

It is appreciated that the address and write data can be generated based upon various factors and objectives. The address value can be sequential or random. Sequential values can provide indications of maximum performance and more complete testing coverage. Random value can provide a more realistic testing simulation of normal non test operations. The data values can also be random to provide a more realistic testing simulation of normal non test operations. A combination of sequential and random addresses can be used (e.g., a percent of sequential versus percent of random, etc.). In some embodiments, the data value stored in multiple locations can be the same to give a more consistent average interpretation of overall write latency for a device.

FIG. 4 is a block diagram of an exemplary test method 400 for determining write latency to the extension memory DUTs in accordance with embodiments of the present disclosure. In one embodiment, the method is performed in an ATE system comprising a motherboard and an external memory device under test (DUT) coupled to the motherboard. The motherboard comprises a processor and local memory. In one embodiment, the processor comprises a processor cache memory and write operations comprise a non-temporal instruction type write operation that does not utilize the processor cache memory.

In block 410, CPU parameters are read and instruction sequences are configured. Method 400 includes two branches, one main branch loop directed to measuring write latency associated with writing data to an external memory DUT and another branch loop directed to tracking overhead time associated with writing data to the external memory DUT. As discussed, the overhead duration is subtracted from the write latency value measured by the main branch loop. After the CPU parameters are read and instruction sequences are configured, the process proceeds in one of the branches. The main branch loop includes blocks 421 through 452 and the second branch loop directed to overhead determination includes block 471 through 488.

In block 421 data is prepared in a CPU register set. An address is stored within a memory range pertaining to the external memory DUT into registers of the processor. The memory range pertaining to the external memory DUT is determined by the processor interfacing with a CXL compliant protocol. A data piece of user data is stored into registers of the processor. In one embodiment, user data is algorithmically generated data or it may be stored in local memory and accessed from there. In block 422, the CPU pipeline is cleared.

The process includes tracking counter values during the write operations. In block 423, a counter in the processor is started. In block 424, a write operation of the data piece is performed in which the write data is forwarded from the registers to the addresses and corresponding data storage locations in the memory range of the external memory DUT.

The write data is written to/stored in the data storage location indicated by the address value in the extension memory. In block 425, the counter is stopped at the completion of the write operation. In some embodiments, the counter is reset.

In block 426, write measurements are made. In some embodiments, making write measurements includes recording a counter value of the counter upon completion of the write operation. At this point, the measurement of the write latency is in counter ticks which could equate to processor cycles. As discussed, this measurement value will be corrected by subtracting an overhead value therefrom for additional accuracy of the write latency measurement.

The process 400 also includes determining/computing an overhead value. In some embodiments, the overhead value is computed based on delays introduced by testing instructions and operations that are not associated with performing the write operation itself. Measuring the overhead includes preparing data in a CPU register set in block 471 (e.g., loading a data piece of the user data and an address into registers of the processor, etc.), clearing a pipeline of the processor in block 472, starting the counter in block 473, stopping the counter in block 474, and recording overhead measurements 475 (e.g., recording a counter value from the counter, etc.). This second loop may be run multiple times to collect multiple overhead values. In block 481, a determination is made if enough points have been processed to get an accurate overhead value. If enough points have be processed, the process proceeds to block 488 and stops measuring overhead. If there are not enough points the process proceeds to block 485 and blocks 471 through 474 are repeated.

The collected overhead measurements are then converted to a single overhead value, e.g., averaging can be performed, or any suitable mathematical formula can be used to accomplish this. The overhead value can be viewed as a measure of the latency that is not directly associated with performing the write instruction but nevertheless introduced by the main branch loop. As discussed, the overhead value is subtracted from the write latency measurement values computed in the main branch loop for additional accuracy of the write latency measurements. For this reason, the second branch loop is executed before the main branch loop is run. In some embodiments, the timing of the first branch loop with respect to the second branch loop may vary (e.g., before, concurrently, intermittently, etc.).

In block 441, write latency in CPU cycles (or counter ticks) is determined in accordance with operation of the main branch loop. In some embodiments, determining the write latency includes subtracting the overhead measurement values from the write measurement values so that write latency of the write operation alone is better measured. In block 442, write latency is characterized in time durations (e.g., second, nanoseconds, etc.) based upon the determined write latency in CPU cycles. Measurements in processor cycles (or counter ticks) are converted to nanoseconds. In block 443, a latency per time duration (e.g., nanoseconds, etc.) is stored in a frequency count table. In some embodiments, the recorded counter value is stored into a frequency table. In one embodiment, the frequency table is stored in the local memory, wherein further the user data is stored in the local memory. In one exemplary implementation, a visualization of the frequency table is rendered (e.g., on a display, on a screen, graphical user interface (GUI), etc.). In one exemplary implementation, the frequency table comprises a respective entry for each recorded counter value for each data piece of the user data written to the external memory DUT. In one embodiment, counter values of the frequency table are converted to nanosecond values.

In block 451, a determination is made if the present address being processed is the last address in the write testing operations. If the address is the last address the process proceeds to block 499 and stops. If the address is not the last address the process proceeds to block 452 and a next address is accessed for the main branch loop. Blocks 421 through 451 are repeated for a next address within the memory range pertaining to the external memory DUT and for a next data piece of the user data until all the user data is written to the external memory DUT. In one embodiment, the next address and the next piece of data are selected based on a user input stride value. It is appreciated that the main branch loop may execute many times and collect many write latency values.

Figure 5:
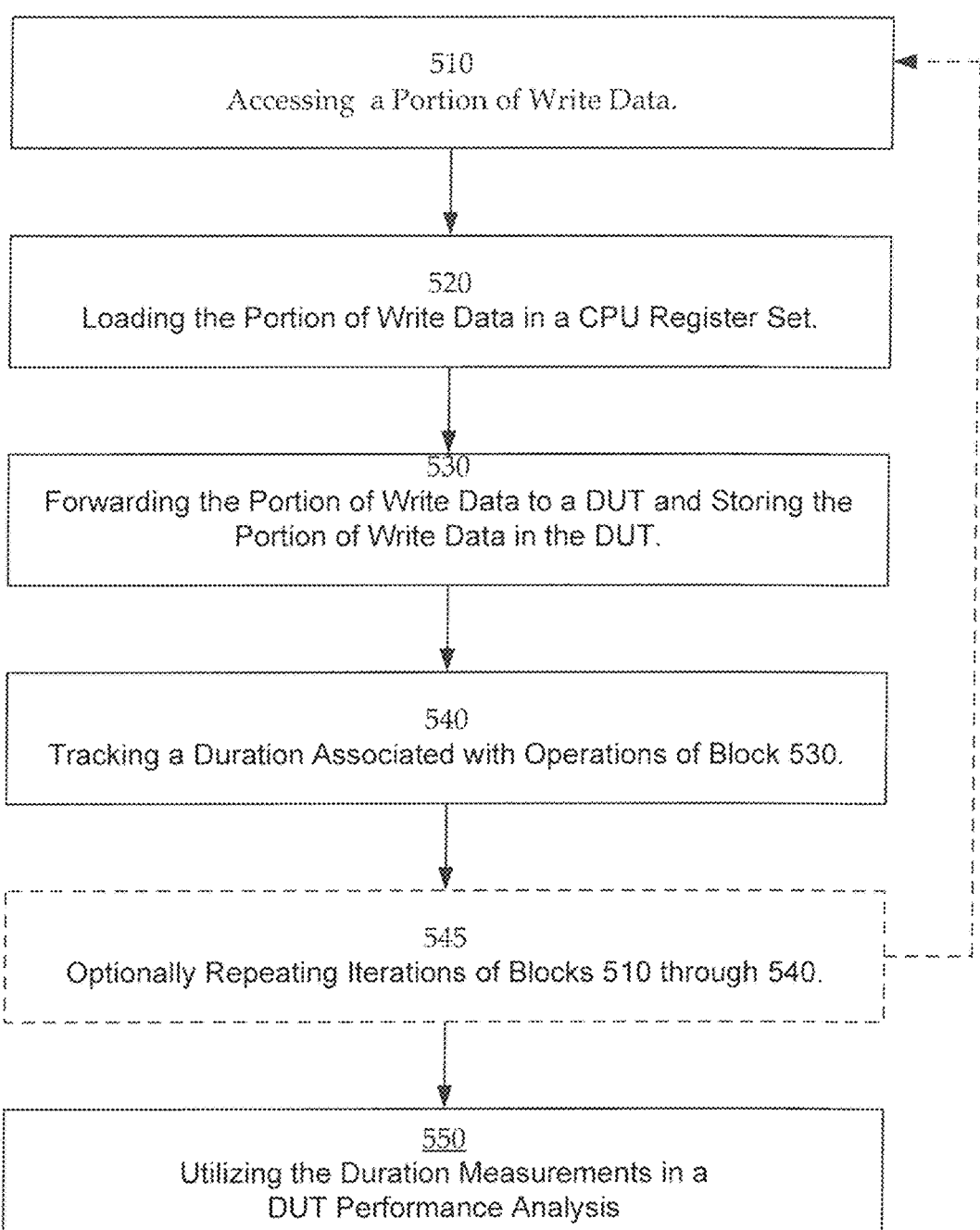
FIG. 5 is a flow chart of another exemplary write latency test method in accordance with embodiments of the present disclosure.

FIG. 5 is a flow chart of an exemplary write latency measurement method 500 in accordance with embodiments of the present disclosure. In block 510, a portion of write data to be written to an external memory DUT and corresponding DUT addresses are accessed. At block 510 the processor pipeline can be cleared. In block 520, the portion of write data and corresponding DUT addresses are loaded in a CPU Register Set. In some embodiments, placing the portion or write data in a CPU register set includes broadcast to Multiple Registers. In block 530, the portion of write data is forwarded from the register set to the external memory DUT and stored in the DUT by performing a write operation. Before and after execution of the write operation, a counter is started and then stopped in code sequence. In block 540, a duration of operations (a write latency value) in block 530 is tracked in accordance with the counter value. In block 545, blocks 510 through 540 are repeated for a plurality of different data write operations. In block 550, the duration measurements are utilized in a DUT performance analysis.

In some embodiments, a host CPU (e.g., 12, 115, 310, etc.) performs the role of a Direct Memory Access (DMA) engine and overcomes challenges associated with an absence of dedicated hardware DMAs. Time or CPU cycles for each write are measured and collecting data from the CPU counters helps ensure precision of the of the measurements. Measuring write latency can involve conducting repeated write operations using latency test units of data (e.g., 64 bytes, 128 bytes, etc.) over a large memory area (e.g., 8 GB, 16 GB, Terabyte, etc.), In some embodiments, the latency test units of data that are written to the extension memory DUT are based upon features or characteristics of the extension memory DUT (e.g., a stride, performance characteristic reported by the extension memory DUT at setup and enumeration, etc.). In some exemplary implementations, testing CXL devices includes measuring, calculating, and profiling either the latency or bandwidth of write operations.

Figure 6:
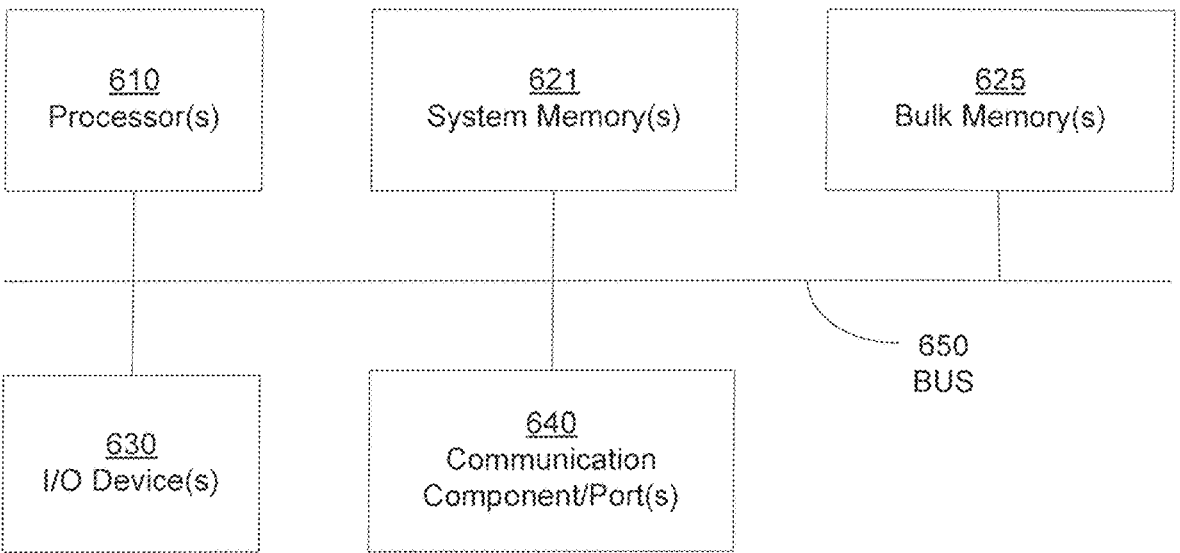
FIG. 6 is a block diagram of an exemplary electronic system which may be used as a platform to implement and control a write process in accordance with embodiments of the present disclosure.

FIG. 6 is a block diagram of an exemplary electronic system 600 which may be used as a platform to implement and control a write process in accordance with embodiments of the present disclosure. System 600 can be user control component 170 and/or can be a part of tester motherboard 111. Electronic system 600 can be a "server" computer system. Electronic system 600 includes a central processor(s) 610, system memory 621, bulk memory 625 (e.g., hard drive, external memory, etc.), input/output (I/O) devices 630, communication component/port 640, and bus 650. Bus 650 is configured to communicatively couple and communicate information between the other components (e.g., central processor(s) 610, system memory 621, bulk memory 625, input/output (I/O) devices 630, communication component/port 640, etc.). Central processor(s) 610 is configured to process information and instructions. System memory 621 (e.g., reads only memory (ROM), random access memory (RAM), etc.) and bulk memory(s) 625 is configured to store information and instructions for the central processor 610. I/O device(s) 630 can communicate information to the system (e.g., central processor 610, memory 625, etc.). I/O devices 630 may be any suitable device for communicating information and/or commands to the electronic system (e.g., a keyboard, buttons, a joystick, a track ball, an audio transducer, a microphone, a touch sensitive digitizer panel, eyeball scanner, display component, light emitting diode (LED) display, plasma display device etc.). Communication port 640 is configured to exchange/communicate information with external devices/network (not shown). A communication port 640 can have various configurations (e.g., limitation RS-232 ports, universal asynchronous receiver transmitters (UARTs), USB ports, infrared light transceivers, ethernet ports, IEEE 13394, synchronous ports, etc.) and can communicate with an external network.

FIG. 7 is an exemplary graphical presentation 700 of DUT write latency information from a frequency table in accordance with embodiments of the present disclosure. Graphical presentation 700 (which may be displayed on display 175 of system 170) includes histograms 710 and 720. Histogram 710 plots write latency information in which count values are tracked on the x axis and frequency or number of the count value occurrences are tracked on the y axis. Histogram 720 plots write latency information in which write latency time values (e.g., nano seconds, etc.) are tracked on the x axis and frequency or number of the time value occurrences are tracked on the y axis. Graphical presentation 700 also includes various statistical analysis related information (e.g., averages, medians, deviation values, etc.). It is appreciated that graphical presentation 700 may also include tabular data.

Figure 8:
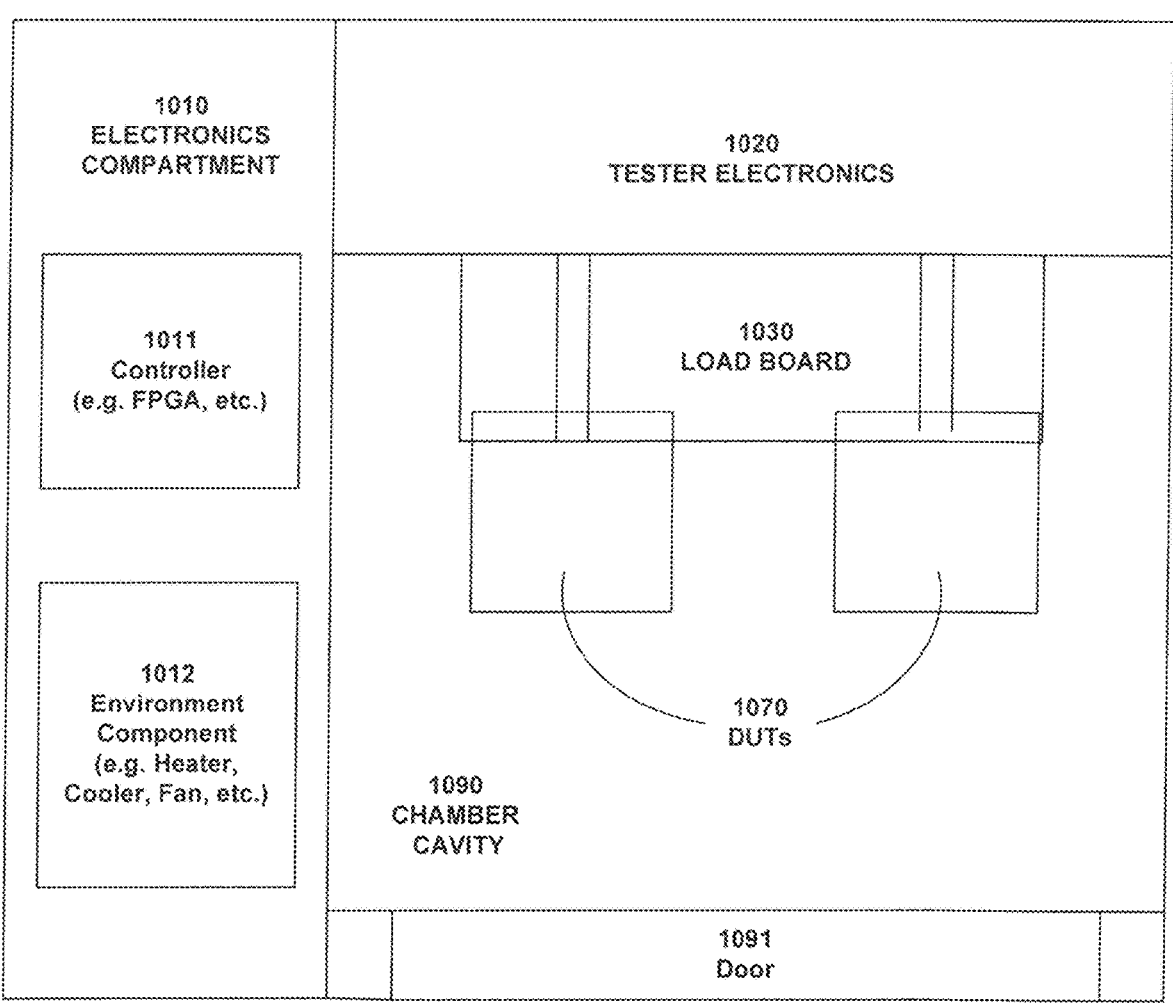
FIG. 8 is a block diagram of an exemplary testing system in accordance with embodiments of the present disclosure.

FIG. 8 is a block diagram of an exemplary testing system 1000 in accordance with embodiments of the present disclosure. Tester system 110 may include additional components as described with respect to system 1000. Testing system 1000 includes electronics compartment 1010 and tester electronics 1020, loadboard 1030, DUTs 1070, and testing chamber 1090 with door 1091. Electronics compartment 1010 includes controller 1011 and environment component 1012. Enhanced loopback components can be inserted instead of the DUTs for diagnostic analysis (e.g., of tester electronics 1020, etc.).

Figure 9:
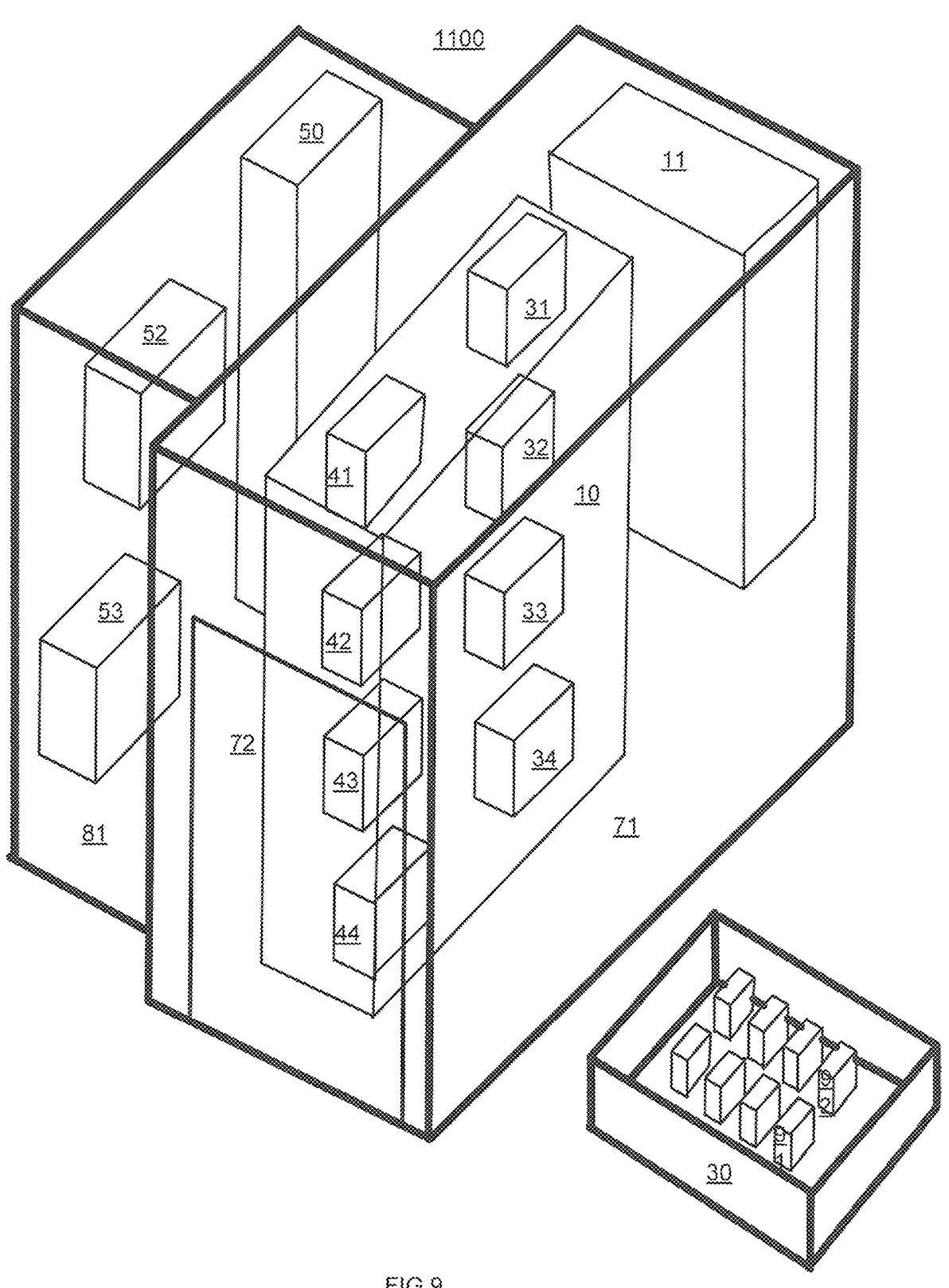
FIG. 9 is a block diagram of an exemplary testing system in accordance with embodiments of the present disclosure.

FIG. 9 is a block diagram of an exemplary testing system 1100 in accordance with embodiments of the present disclosure including automated DUT handlers and carriers. Tester system 110 may include additional components as described with respect to system 1100. System 1100 consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 15. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The loadboard trays (e.g., 30, 31, etc.) are connected to tester slices 50 (multiple loadboard trays can be coupled to a single tester slice). There is also a block diagram of a tester tray 30 and devices under test (e.g., 91, 92, etc.). The loadboard trays are manually populated with devices under test. The full tester trays (e.g., 30, 31, etc.) are inserted into environmental chamber 71 and connected to the tester electronics (e.g., 50, 52, 53, etc.).

In one embodiment, a test system includes a device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their loadboards can be conveniently setup to accommodate different device form factors. In one embodiment, loadboards are configured with device under test interfaces and universal primitive interfaces. In one exemplary implementation, the device interface board can control an ambient environment of a device under test.

Figure 10:
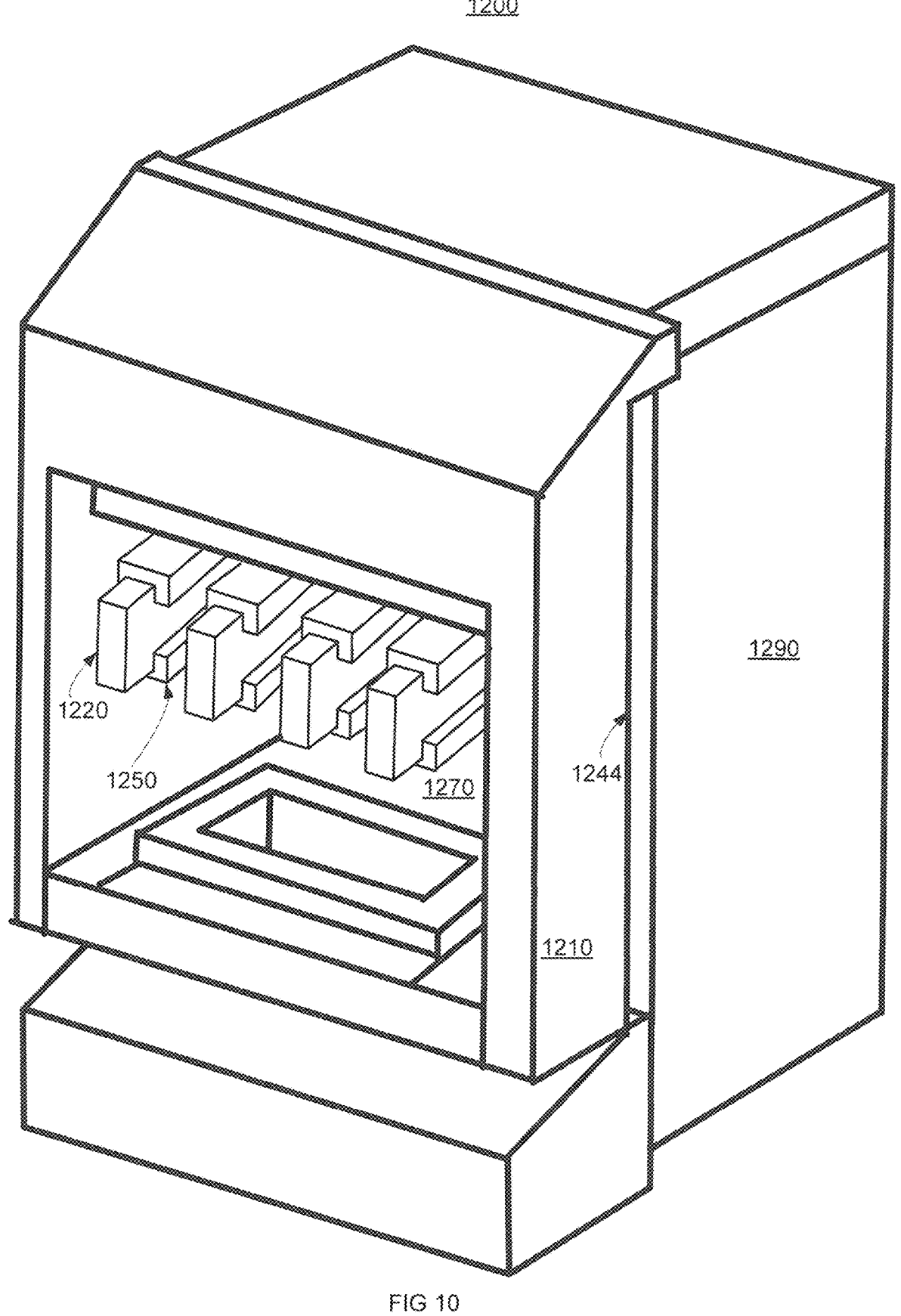
FIG. 10 is a block diagram of another exemplary test system in accordance with embodiments of the present disclosure.

FIG. 10 is a block diagram of an exemplary test system 1200 in accordance with embodiments of the present disclosure. Tester system 110 may include additional components as described with respect to system 1200. Test system 1200 includes a testing primitive 1290 (e.g., containing the testing control hardware and power supply components for the devices under test, etc.) and a device interface board (DIB) 1210 disposed in front of and coupled to the primitive 1290. In one embodiment, the device interface board 1210 is a partial enclosure. The loadboard is also coupled to and electrically interfaces with the primitive 1290 to obtain power and high-speed electrical signals for testing the device under test (DUT) 1220. DUT 1220 is coupled to socket 1250 which is coupled to DIB 1210. The device interface board can include air flow channels 1244 that allow air flow to and from the device under test environment. The air flow channels 1244 can include baffles. The device interface board 1210 partial enclosure includes a device under test access interface 1270 that enables easy physical access (e.g., unobstructed, unimpeded, etc.) to the devices under test. Environmental control components (not shown) control and maintain device under test ambient environmental conditions (e.g., temperature, air flow rate, etc.). The environmental control components can create an environmental envelope that prevents or mitigate interference from outside environmental conditions on the operations of devices under test. Enhanced loopback components can be inserted instead of the DUTs for diagnostic analysis of tester electronics (e.g., in primitive 1290, etc.).

While the disclosure has been described in conjunction with the preferred embodiments, it will be understood that they are not intended to limit the disclosure to these embodiments. On the contrary, the disclosure is intended to cover alternatives, modifications, and equivalents. The description is not intended to be exhaustive or to limit the disclosure to the precise forms disclosed, and obviously many modifications and variations are possible.

The novel testing approaches presented herein provide an accurate measurement of write latency values to an external memory coupled to a tester. The write latency values can be used to measure the performance of the external memory and/or bin external memory devices in accordance with performance measurements.

1. In some embodiments, a method of determining write latency in a testing system comprises a motherboard comprising a processor and local memory, and an external memory device under test (DUT) coupled to said motherboard, said method comprising a) storing an address within a memory range pertaining to said external memory DUT into registers of said processor, b) storing a data piece of user data into registers of said processor, c) starting a counter in said processor, d) performing a write operation of said data piece from said registers to said address in said memory range of said external memory DUT, e) recording a counter value of said counter upon completion of said write operation, f) storing said counter value into a frequency table, and g) repeating steps a)-f) for a next address within said memory range pertaining to said external memory DUT and for a next data piece of said user data until said user data is written to said external memory DUT.

2. The method as described in Clause 1 further comprising determining said memory range pertaining to said external memory DUT by said processor interfacing with a CXL compliant protocol.

3. The method as described in Clauses 1 or 2 wherein said frequency table is stored in said local memory, wherein further said user data is stored in said local memory and further comprising rendering a visualization of said frequency table.

4. The method as described in Clauses 1 through 3 wherein said c) starting a counter in said processor comprises c1) clearing a pipeline of said processor, and c2) starting said counter in said processor.

5. The method as described in Clauses 1 through 4 further comprising computing an overhead counter value based on loading a data piece of said user data and an address into registers of said processor, clearing a pipeline of said processor, starting a counter, and recording an overhead counter value from said counter, and wherein said e) recording a counter value of said counter upon completion of said write operation comprises subtracting said overhead counter value from said counter value.

6. The method as described in Clauses 1 through 5 wherein said piece of user data is algorithmically generated data.

7. The method as described in Clauses 1 through 6 wherein said frequency table comprises a respective entry for each recorded counter value for each data piece of said user data written to said external memory DUT.

8. The method as described in Clauses 1 through 7 further comprising converting counter values of said frequency table to nanosecond values.

9. The method as described in Clauses 1 through 8 wherein said processor comprises a processor cache memory and wherein further said write operation comprises a non-temporal instruction type that does not utilize the processor cache memory.

10. The method as described in Clauses 1 through 9 wherein said next address and said next piece of data are selected based on a user input stride value.

11. In some embodiments, a testing system comprises a motherboard comprising a processor comprising registers, and a local memory, and an extension memory device under test (DUT) coupled to said motherboard and comprising a memory address range associated therewith, wherein said processor is operable to execute test instructions to perform a method of determining write latency to said extension memory DUT, said method comprising a) storing an address within said memory range pertaining to said extension memory DUT into one or more registers of said processor, b) storing a data piece of user data into one or more registers of said processor, c) starting a counter in said processor, d) performing a write operation of said data piece from said one or more registers to said address in said memory range of said extension memory DUT, e) stopping said counter upon completion of said write operation, f) storing a counter value from said counter into a frequency table, and g) repeating steps a)-f) for a next address within said memory range pertaining to said extension memory DUT and for a next data piece of said user data until said user data is written to said extension memory DUT, wherein said next data piece and said next address are selected based on a user supplied stride value.

12. The testing system as described in Clause 11 wherein said method further comprises determining said memory address range pertaining to said extension memory DUT by said processor interfacing with a CXL compliant protocol and wherein said frequency table is stored in said local memory and wherein said method further comprises rendering a visualization of said frequency table.

13. The testing system as described in Clauses 11 or 12 wherein said processor comprises a processor cache memory and further wherein said write operation comprises a non-temporal instruction type that does not utilize the processor cache memory.

14. The testing system as described in Clauses 11 through 13 wherein the method further comprises computing an overhead counter value based on loading a data piece of said user data and an address into registers of said processor, clearing a pipeline of said processor, starting a counter, and recording an overhead counter value from said counter, and wherein said f) storing a counter value from said counter into a frequency table comprises subtracting said overhead counter value from said counter value.

15. In some embodiments, a testing system comprises a motherboard comprising a processor and a local memory, wherein the local memory corresponds to a first address range within a system memory associated with the processor, and an extension memory device under test (DUT) configured to couple with the motherboard, said extension memory DUT associated with a second address range within the system memory, wherein said processor is operable to direct testing of said extension memory DUT, and wherein said testing comprises recording write latency of a plurality of write operations executed by said processor to said extension memory DUT.

16. The testing system of Clause 15, wherein the recording is done in a memory resident frequency table.

17. The testing system of Clauses 15 or 16, further comprising a computer system comprising a display and wherein the frequency table is visualized on said display.

18. The testing system of Clauses 15 through 18, wherein said extension memory DUT is compatible with a compute express link (CXL) protocol.

19. The testing system of Clauses 15 through 18, wherein said write operations comprise non-temporal write instructions.

20. The testing system of Clause 15 or 19, wherein said extension memory DUT is one of a plurality of extension memory DUTs that are independently tested concurrently.

In some embodiments, one or more non-transitory computer-readable media store instructions which, when executed by one or more processors of an ATE, cause the one or more processors to perform operations of any of methods in clauses 1-14.

In sum, embodiments of the present invention include a system of testing and a method for testing involving a motherboard having a processor situated thereon and external memory devices coupled to the motherboard. The testing method includes measuring write latency of data from the processor to the external memory. Using the novel method, the write latency of data from the processor to external memory can be measured over a plurality of data write operations and the results are stored in a frequency table within local memory of the motherboard. The data that is written to compute the write latency with respect to the external memory can come from user data within the local memory, or can be algorithmically generated. The frequency table can be visualized on a display screen either graphically or in tabular form. In one embodiment, the write latency is measured in cycles of the processor by a counter that is started and then stopped by instructions that are before and after the write instruction in code sequence. The latency measurement is then converted to nanoseconds within the frequency table. The frequency table data can be used to determine performance and operability of the external memory. In one embodiment, the external memory is extension memory compatible with the CXL communication protocol.

Moreover, the disclosed techniques overcome the limitations of traditional systems and methods by enabling accurate write latency testing of extension memory DUTs. In some embodiments, the testing utilizes non-temporal instructions that bypasses caches in the CPU. The disclosed techniques also include mitigation of overheads introduced by testing operations. The disclosed techniques include measurement of write latency values and memory extension DUT write latency performance analysis based on the measured write latency values. In some exemplary implementations, the write latency information (e.g., frequency tables, statistical distributions, etc.) can be presented or rendered on a display.

At least one technical advantage of the disclosed techniques is the ability to perform write latency testing, unlike traditional testing that did not provide this capability. While read latency of external memory DUTs may have been tested in the past, effective and efficient write latency testing measurements were not available. Accurate write latency values are important in ensuring proper and reliable performance of the extension memory DUTs in meeting application timing requirements. The graphical display of write latency information conveys important characteristics and features of writing data to extension memory DUTs in a convenient and easy to comprehend manner.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. While the preceding is directed to embodiments of the present disclosure, other and further embodiments of the disclosure may be devised without departing from the basic scope thereof, and the scope thereof is determined by the claims that follow.

Embodiments of the present disclosure are thus described. While the present disclosure has been described in particular embodiments, it should be appreciated that the present disclosure should not be construed as limited by such embodiments, but rather construed according to the following claims.

What is claimed is:

1. A method of determining write latency in a testing system comprising: a motherboard comprising a processor and local memory; and an external memory device under test (DUT) coupled to said motherboard, said method comprising:
    a) storing an address within a memory range pertaining to said external memory DUT into registers of said processor;
    b) storing a data piece of user data into registers of said processor;
    c) starting a counter in said processor;
    d) performing a write operation of said data piece from said registers to said address in said memory range of said external memory DUT;
    e) recording a counter value of said counter upon completion of said write operation;
    f) storing said counter value into a frequency table; and
    g) repeating steps a)-f) for a next address within said memory range pertaining to said external memory DUT and for a next data piece of said user data until said user data is written to said external memory DUT.

2. The method as described in claim 1 further comprising determining said memory range pertaining to said external memory DUT by said processor interfacing with a CXL compliant protocol.

3. The method as described in claim 1 wherein said frequency table is stored in said local memory, wherein further said user data is stored in said local memory and further comprising rendering a visualization of said frequency table.

4. The method as described in claim 1 wherein said c) starting a counter in said processor comprises:
    c1) clearing a pipeline of said processor; and
    c2) starting said counter in said processor.

5. The method as described in claim 1 further comprising computing an overhead counter value based on: loading a data piece of said user data and an address into registers of said processor; clearing a pipeline of said processor; starting a counter; and recording an overhead counter value from said counter, and wherein said e) recording a counter value of said counter upon completion of said write operation comprises subtracting said overhead counter value from said counter value.

6. The method as described in claim 1 wherein said data piece of user data is algorithmically generated data.

7. The method as described in claim 1 wherein said frequency table comprises a respective entry for each recorded counter value for each data piece of said user data written to said external memory DUT.

8. The method as described in claim 7 further comprising converting counter values of said frequency table to nanosecond values.

9. The method as described in claim 1 wherein said processor comprises a processor cache memory and wherein further said write operation comprises a non-temporal instruction type that does not utilize the processor cache memory.

10. The method as described in claim 1 wherein said next address and said next piece of data are selected based on a user input stride value.

11. A testing system comprising:
    a motherboard comprising: a processor comprising registers; and a local memory; and
    an extension memory device under test (DUT) coupled to said motherboard and comprising a memory address range associated therewith, wherein said processor is operable to execute test instructions to perform a method of determining write latency to said extension memory DUT, said method comprising:
    a) storing an address within said memory range pertaining to said extension memory DUT into one or more registers of said processor;
    b) storing a data piece of user data into one or more registers of said processor;
    c) starting a counter in said processor;
    d) performing a write operation of said data piece from said one or more registers to said address in said memory range of said extension memory DUT;
    e) stopping said counter upon completion of said write operation;
    f) storing a counter value from said counter into a frequency table; and
    g) repeating steps a)-f) for a next address within said memory range pertaining to said extension memory DUT and for a next data piece of said user data until said user data is written to said extension memory DUT, wherein said next data piece and said next address are selected based on a user supplied stride value.

12. The testing system as described in claim 11 wherein said method further comprises determining said memory address range pertaining to said extension memory DUT by said processor interfacing with a CXL compliant protocol and wherein said frequency table is stored in said local memory and wherein said method further comprises rendering a visualization of said frequency table.

13. The testing system as described in claim 11 wherein said processor comprises a processor cache memory and further wherein said write operation comprises a non-temporal instruction type that does not utilize the processor cache memory.

14. The testing system as described in claim 11 wherein the method further comprises computing an overhead counter value based on: loading a data piece of said user data and an address into registers of said processor; clearing a pipeline of said processor; starting a counter; and recording an overhead counter value from said counter, and wherein said f) storing a counter value from said counter into a frequency table subtracting said overhead counter value from said counter value.

15. A testing system comprising:

a motherboard comprising a processor and a local memory, wherein the local memory corresponds to a first address range within a system memory associated with the processor; and an extension memory device under test (DUT) configured to couple with the motherboard, said extension memory DUT associated with a second address range within the system memory, wherein said processor is operable to direct testing of said extension memory DUT, and wherein said testing comprises recording write latency of a plurality of write operations executed by said processor to said extension memory DUT.

16. The testing system of claim 15, wherein the recording is done in a memory resident frequency table.

17. The testing system of claim 16, further comprising a computer system comprising a display and wherein the frequency table is visualized on said display.

18. The testing system of claim 15, wherein said extension memory DUT is compatible with a compute express link (CXL) protocol.

19. The testing system of claim 15, wherein said write operations comprise non-temporal write instructions.

20. The testing system of claim 15, wherein said extension memory DUT is one of a plurality of extension memory DUTs that are independently tested concurrently.

* * * * *